THYRATRON IMPULSE GENERATOR

Filed Sept. 24, 1958

3,038,102
Patented June 5, 1962

3,038,102

THYRATRON IMPULSE GENERATOR

Elliott A. Henry, Newtown, and Edward R. Laposka, Bridgeport, Conn., assignors to Sperry Products, Inc., a corporation of New York Filed Sept. 24, 1958, Ser. No. 763,017
6 Claims. (Cl. 315—176)

This invention relates to the generation of electrical impulses such as are commonly employed as trigger or gating signals to control the operation of electrical or electronic circuits, and more specifically to the generation of such electrical impulses by the switch action of a gas filled or thyratron tube.

Several circuit arrangements for generating electrical impulses by the switch action of thyratron tubes have been developed and are well known to the art, such as the line controlled pulse generator employed extensively as a modulator in radar equipments and the shock excitation of an inductor or resonant inductance/capacity tank circuit. In the latter, it has been the practice either to resistance damp the resonant circuit or shunt the resonant circuit or inductance with a diode tube arranged to conduct when the polarity of the generated voltage is opposite to the initial polarity of the first half cycle of the generated wave train. Both of these prior methods have serious limitations: where resistance damping is employed, the efficiency is very low and the waveform of the output signal is essentially the differentiated output of the plate waveform, if the resonant circuit is critically damped; and a wave train, not an impulse, is generated when the damping is less than critical. The purpose of the shunting diode, in place of the resistance damping, is to short circuit the inductor or tank circuit after the first half cycle of the high frequency wave train that would be generated in the absence of resistance damping or the diode, and the effectiveness of the diode is a function of its conducting impedance. If the conducting impedance of the diode has a value equal to or greater than the value required for critical damping, the stored energy in the tank circuit or inductance will be dissipated by the diode and the output wave will be an electrical impulse having a waveshape that is essentially a half sine wave at the resonant frequency. In practice, it has not been possible to obtain the desired performance from such circuitry, as a result of the high conducting impedance of high vacuum diode tubes and the time delay inherent in semi-conductor and gas diodes. Thus, the use of such circuitry is severely restricted, being applicable primarily for high impedance loads and where the tank impedance can be made sufficiently high so that the value of the conducting impedance of the diode is equal to or greater than the value required for critical damping.

These deficiencies of previous electrical impulse generators are eliminated in our invention, herein disclosed and described in detail, which has the principal objective of providing an arrangement for generating unit electrical impulses having fast rise and decay times and which are free from overshoot.

It is a further object of the invention to provide an electrical impulse generator employing a thyratron switch tube, wherein the thyratron tube provides both the switch and damper diode functions.

It is a further object to provide an efficient and economical electrical impulse generator, wherein a thyratron provides both the switch and damper diode functions, and wherein the impulse polarity, amplitude and duration are readily controllable.

It is a further object to provide, in combination with an economical electrical impulse generator, an efficient means for generating acoustical impulses or wave trains.

In general, we achieve the improved results by utilizing a four-electrode (tetrode) type of gas discharge tube, to accomplish both the triggering and damping functions heretofore requiring separate devices. This not only simplifies the generator but, as will appear, produces a markedly superior result in terms of lower delay time, better damping, and increased efficiency.

Further objects and advantages of this invention will become apparent from the following detailed description thereof, taken in connection with the appended drawings, in which.

Figure 1:
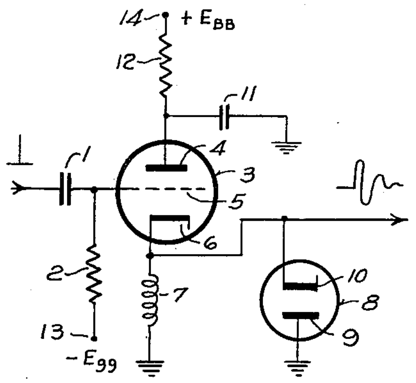
Fig. 1 (PRIOR ART)
FIGURE 1 is a schematic diagram illustrating a typical thyratron impulse generator, according to the previous state of the art, as discussed in the above introduction.

Referring to FIGURE 1, there is shown a thyratron or gas filled tube 3 containing an anode 4, a cathode 6 and a grid 5 interposed between said anode and cathode; an input coupling network comprising capacitor 1 and resistor 2; an anode charging capacitor 11 that receives its charge from the the high voltage supply 14 through the charging or current limiting resistor 12; an inductor 7 connected between the cathode 6 and ground and a diode vacuum tube 8 having an anode 9 and a cathode 10, said anode being connected to ground and said cathode being connected to the cathode 6 of the thyratron 3 and to the ungrounded end of the inductor 7.

In this circuit, if the time constant of the anode charging network 11, 12 is less than about one-fifth the period between initiating triggers, capacitor 11 will be charged to the full supply voltage in the quiescent period, as the thyratron 3 will be maintained in a non-conducting state by the negative bias from 13. When the initiating trigger arrives, the thyratron conducts and the conducting impedance between anode 4 and cathode 6 changes from an infinitely high value to a very low value and capacitor 11 discharges into the inductor 7. While the thyratron is conducting, inductor 7, capacitor 11 and the conducting impedance of the thyratron form a parallel resonant circuit that has been shocked into oscillation by the sudden release of the energy stored in the capacitor 11. During the initial conduction of the thyratron 3, the electron flow is in such a direction (cathode to anode) as to generate a positive voltage across the inductor 7, holding the diode 8 in a non-conducting state. When capacitor 11 is discharged, after transferring its stored energy into the inductor 7, the direction of the electron flow is reversed, because the voltage generated by the collapsing field of the inductor 7 is out of phase with the voltage generated when the inductor was being initially charged. When the voltage on the diode cathode becomes negative with respect to ground the diode 8 conducts, becoming effectively a low value resistor, thus damping the tank circuit. The effectiveness of the damping is a function of the conducting impedance of the diode, and if this impedance is not sufficiently low as to provide critical damping, a wave train rather than an impulse is generated, as shown by the output wave in the figure. This is all described in the previous art.

High vacuum diode tubes do not have sufficiently low conducting impedances to provide critical damping, the impedances being in the order of 300 to 400 ohms whereas conducting impedances of less than 5 ohms are generally required. Semi-conductor diodes and gas diodes have lower conducting impedances, but have appreciable delay times for fast rising voltages, the time delay of the former being a function of the mobility of the carriers and the time delay of the latter being a function of the ionization time of gas tubes during which the gaseous plasma is formed. The foregoing illustrates the state of the art with respect to thyratron electrical impulse generators. These limitations are overcome and the separate diode, such as 8 in FIGURE 1, is eliminated by our invention.

Figure 2:
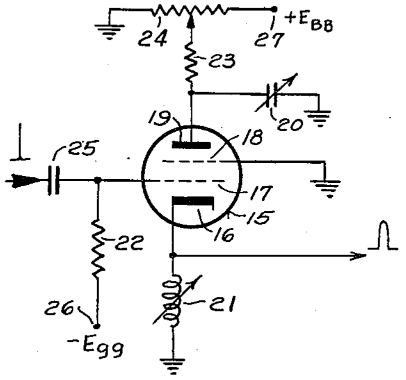
FIGURE 2 is a schematic diagram showing one form of the invention, arranged for generating positive polarity electrical impulses.

FIGURE 2 is a schematic diagram of a preferred form of our invention, showing the arrangement for generating positive impulses and the means for varying both the impulse amplitude and duration. In this arrangement, a tetrode type thyratron 15, such as the RETMA type 2D21 or 5727, is employed, and provides both the switch and diode functions, the latter function being characterized by a very low conducting impedance having an order of magnitude of one to two ohms, effectively clipping the entire overshoot and yielding a unit impulse output from the generator. The operation of this circuit is exactly as previously described except for the diode action.

Figure 3:
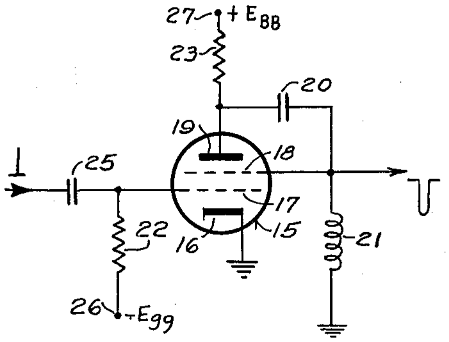
FIGURE 3 is a schematic diagram showing another form of the invention wherein negative polarity electrical impulses are generated.
Figure 4:
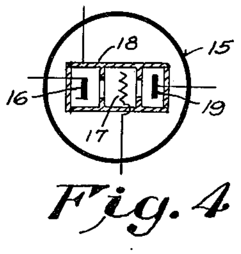
FIGURE 4 illustrates the geometry of a tetrode thyratron tube, such as the standard type RETMA type 5727, and the theory of the invention.

For an explanation of the tube operation, reference is now made to FIGURE 4 which illustrates the geometry of such tetrode thyratrons and the theory of operation. The second grid 18 in tetrode thyratrons has the form of a three-compartment conductive shield with narrow windows in the center of the barriers between the anode 19 and the grid 17, and the cathode 16 and grid 17, the whole assembly being contained in the gas. It is apparent that the portion of the second grid 18 that forms the cathode compartment, and almost totally surrounds it, is an excellent anode. When the thyratron fires, the main gaseous plasma is formed and provides the conducting path through the barrier apertures between anode 19 and cathode 16. However, a less dense plasma continuously exists in all compartments due to random collisions of electrons and ions, but the total resistance of the plasma between the cathode 16 and the second grid 18 is very low, a result of the greater area of the anode and the closer spacing between the cathode and second grid (diode anode). There is no delay in the diode action, as would be the case with an external gas diode, because the plasma has already been formed when the thyratron fires, and conduction is initiated immediately when the cathode goes negative with respect to the second grid 18, with no delay.

Where a positive output impulse is desired, the inductor 21 (FIGURE 2) is placed between cathode 16 and ground and the second grid 18 also is grounded. Where a negative polarity impulse is desired, the circuit arrangement of FIGURE 3 may be used. Examination of FIGURES 2 and 3 will show that only the ground point has been changed, and the operation of both is identical.

FIGURE 2 also shows the method of controlling the amplitude and duration of the generated impulse. The amplitude is controlled by the potentiometer 24 that controls the magnitude of the charge on capacitor 20 and therefore the amplitude of the generated impulse. In this figure, both capacitor 20 and inductor 21 are shown to have variable magnitudes. As the output impulse is essentially a half sine wave at the resonant frequency of inductor 21 and capacitor 20, a decrease in the value of either will decrease the impulse duration, and conversely an increase in the value of either will increase the impulse duration.

It will be apparent to one skilled in the art that inductor 21 could be the primary of a transformer or autotransformer to provide increased amplitude output impulses.

Figure 5:
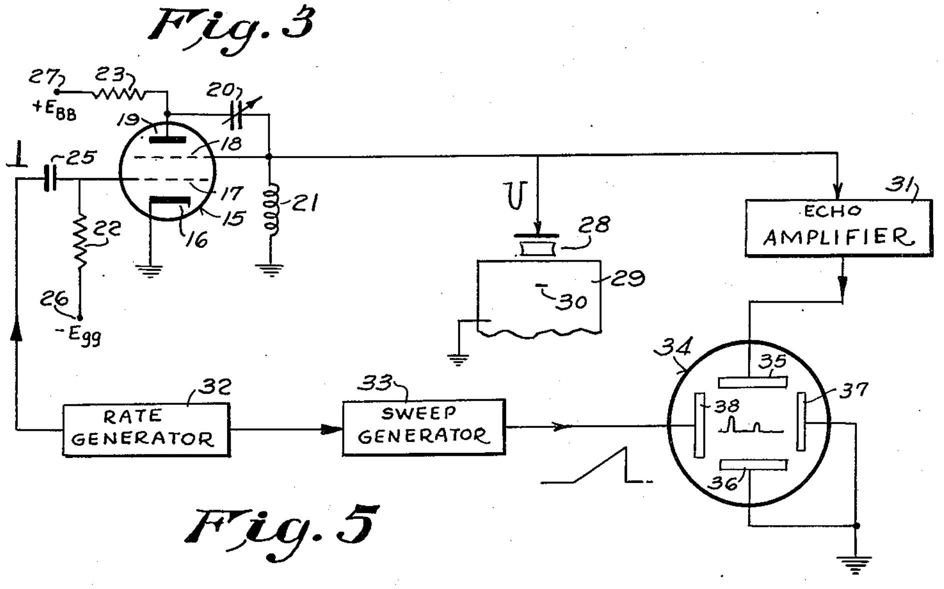
FIGURE 5 is a drawing, in block and schematic form, illustrating the employment of the electrical impulse generating arrangement of FIGURE 3 for the generation of short acoustical impulses or wave trains in ultrasonic materials inspection equipment, such as the Ultrasonic Reflectoscope.

FIGURE 5 shows our improved impulse generator as employed for example in an Utrasonic Reflectoscope, an instrument for non-destructive materials inspection disclosed and fully described by F. A. Firestone in U.S. Patent 2,398,701 granted April 16, 1946; here the impulse generator operates to energize a piezo-electric transducer 23 that converts the electrical impulses into acoustic impulses and couples them into the test specimen 29 through a suitable couplant such as oil. The acoustic impulses will propagate through the test specimen 29 and upon striking a reflecting boundary such as, for example, the defect 30 within the object, will be reflected back to the transducer which will generate an electrical voltage. The time interval between transmission and reception may be indicated on the face of a cathode-ray tube 34. The time base is furnished by the sweep generator 33, initiated by the rate generator 32 coincident with initial impulse generated by the impulse generator, here comprising tube 15 and its associated components. The use of this impulse generator, in place of the wave train generator previously employed, is to improve the range resolution and close-to-surface resolution. This is accomplished by adjusting the duration of the electrical impulse, by means of the variable capacitor 20, to a time exactly equal to the period of one cycle at the crystal frequency. Under this condition the internal crystal displacements and the electric field of the trailing edge of the impulse will be out of phase, and the crystal will cease vibrating. The action is equivalent to dynamic braking of a motor.

The invention thus provides, in a single tube circuit, a pulse generator free from the disadvantages of prior art circuitry with respect to excessive time delay and consequent overshoot, and also with respect to the unduly high effective damping impedance exhibited by such circuitry. The improvement is obtained by virtue of the novel arrangement as applied to a tetrode type of gas-filled tube, and without any additional components; in fact, as has been described, the complexity of prior circuits has actually been reduced by the elimination of the separate damper tube.

Having described our invention, what we claim and desire to secure by Letters Patent is:

1. A pulse generator for the production of an output pulse of preselected amplitude and duration in response to the occurrence of a control pulse, comprising a gas filled thermionic tube including at least an anode, a cathode, a control electrode between said anode and cathode, and a shield electrode substantially surrounding said anode, said cathode and said control electrode and defining a restricted channel between said anode and said cathode; a source of space-current discharge potential connected between said anode and said cathode, a timing capacitor connected between said anode and said shield electrode, means biasing said control electrode normally below cutoff with respect to said cathode, a control pulse input circuit connected between said control electrode and said cathode, a timing inductance connected between said cathode and said shield electrode of said tube, and means coupled to said timing inductance for deriving an output pulse from said timing inductance.

2. A pulse generator in accordance with claim 1, in which said timing inductance is in series circuit relation with the anode-cathode current path of said tube, and in which the means for deriving an output pulse comprises a direct connection to said cathode.

3. A pulse generator in accordance with claim 1, in which said cathode is connected to a point of reference potential, and in which the means for deriving an output pulse comprises a direct connection to said shield electrode.

4. A pulse generator for the production of an output pulse of preselected amplitude and duration in response to the occurrence of a control pulse, comprising a gas filled thermionic tube including at least an anode, a cathode, a control electrode between said anode and cathode, and a shield electrode substantially surrounding said anode, said cathode and said control electrode and defining a restricted channel between said anode and said cathode; a source of space-current discharge potential connected between said anode and said cathode, a timing circuit including a capacitor connected between said anode and said shield electrode an inductive impedance connected between said shield electrode and said cathode, means biasing said control electrode normally below cutoff with respect to said cathode, a control pulse input circuit connected between said control electrode and said cathode, and means coupled to said timing circuit for deriving an output pulse from said timing circuit.

5. A pulse generator comprising: a gas filled electron discharge device including an anode, a cathode, a control electrode and a shield electrode positioned in spaced coupling relationship to said anode, said cathode and said control electrode; means for applying a space-current discharge potential between said anode and said cathode; a storage capacitor connected between said anode and said cathode; an inductive impedance connected between said shield electrode and said cathode; means for biasing said control electrode at a potential below that at which anode-cathode current in said discharge device is cut off; an input circuit coupled to said control electrode and said cathode for applying a control pulse thereto; and means coupled to said inductive impedance for deriving an output pulse therefrom.

6. Apparatus for non-destructive testing comprising: a gas filled electron discharge device including an anode, a cathode, a control electrode and a shield electrode positioned in spaced coupling relationship to said anode, said cathode and said control electrode; means for applying a space-current discharge potential between said anode and said cathode; a storage capacitor connected between said anode and said cathode; an inductive impedance connected between said shield electrode and said cathode; means for biasing said control electrode at a potential below that at which anode-cathode current in said discharge device is cut off; an input circuit coupled to said control electrode and said cathode for applying a control pulse thereto; a transducer coupled to said inductive impedance; and indicator means coupled to said transducer.

References Cited in the file of this patent

UNITED STATES PATENTS

| | | |
|---|---|---|
| 2,538,577 | McCarty | Jan. 16, 1951 |
| 2,576,585 | Fleming | Nov. 27, 1951 |
| 2,752,531 | Westberg | June 26, 1956 |
| 2,922,080 | Thomas | Jan. 19, 1960 |